United States Patent [19]

Iketani et al.

[11] Patent Number: 5,703,510

[45] Date of Patent: Dec. 30, 1997

[54] POWER ON RESET CIRCUIT FOR GENERATING RESET SIGNAL AT POWER ON

[75] Inventors: Masayuki Iketani; Shigeki Ohbayashi, both of Hyogo, Japan

[73] Assignee: Mitsubishi Denki Kabushiki Kaisha, Tokyo, Japan

[21] Appl. No.: 608,075

[22] Filed: Feb. 28, 1996

[51] Int. Cl.⁶ .................................................. H03L 7/00
[52] U.S. Cl. .................... 327/143; 327/198; 327/546
[58] Field of Search ................................ 327/142, 143, 327/198, 399, 544, 545, 546

[56] References Cited

U.S. PATENT DOCUMENTS

| | | | |
|---|---|---|---|
| 5,347,173 | 9/1994 | McAdams | 327/143 |
| 5,374,923 | 12/1994 | Sakamoto | 327/143 |
| 5,523,710 | 6/1996 | Miyake et al. | 327/142 |
| 5,528,184 | 6/1996 | Gola et al. | 327/198 |
| 5,612,641 | 3/1997 | Sali | 327/198 |

FOREIGN PATENT DOCUMENTS

| | | |
|---|---|---|
| 61-222318 | 10/1986 | Japan. |
| 7-15308 | 1/1995 | Japan. |
| 7-24379 | 3/1995 | Japan. |

*Primary Examiner*—Timothy P. Callahan
*Assistant Examiner*—Jung Ho Kim
*Attorney, Agent, or Firm*—Lowe, Price, LeBlanc & Becker

[57] ABSTRACT

A power on reset circuit includes a transistor connected between a power supply node and a first node, a first capacitor connected between a ground node and a first node, a resistance element connected parallel to the first capacitor, a first CMOS inverter circuit having an input node connected to the first node and an output node connected to the second node, and a second CMOS inverter circuit having an input node connected to the second node and an output node connected to the first node. Preferably, the power on reset circuit further includes a second capacitor connected between the power supply node and the second node. In the power on reset circuit, when the power is turned off, the first capacitor is fully discharged by the resistance element. Therefore, a reset signal for initializing internal circuitry can be surely generated even when the power is again turned on.

4 Claims, 6 Drawing Sheets

POWER ON RESET CIRCUIT FOR GENERATING RESET SIGNAL AT POWER ON

BACKGROUND OF THE INVENTION

1. Field of the Invention

The present invention relates to a power on reset circuit. More specifically, the present invention relates to a power on reset circuit used in an SRAM (Static Random Access Memory), a DRAM (Dynamic random Access Memory) or the like, for initializing internal circuitry thereof when the power is turned on.

2. Description of the Background Art

In a semiconductor integrated circuit device such as the SRAM, DRAM or the like, a power on reset circuit for resetting the internal circuitry at the time of power on has been used. For example, Japanese Patent Laying-Open No. 61-222318 discloses a power on reset circuit capable of generating a reset signal even if rise of a power supply voltage is moderate. A structure of a conventional typical power on reset circuit similar to that disclosed in this application is shown in FIG. 1.

Referring to FIG. 1, before power on, the voltage VA at a node NA, the voltage VB at a node NB and the voltage VC at a node NC are all at an L (logic low) level (ground voltage Vss). When the power is turned on and the power supply voltage Vdd at a power supply node 11 becomes higher than 2×Vth (Vth: threshold voltage of transistors 13, 14), transistors 13 and 14 turn on, charging of capacitor 15 starts, and the voltage VA at node NA starts to increase. When the power supply voltage Vdd rises to a voltage which allows operation of inverters 18 and 19, inverter 18 generates a signal at an H (logic high) level, and in response to the H level signal, inverter 19 generates a power on reset signal POR which is at the L level. In response to the power on reset signal POR at the L level, internal circuitry of the SRAM, DRAM or the like is initialized. When the power supply voltage Vdd further rises and exceeds the threshold value of inverter 18, inverter 18 generates an L level signal, and in response to the L level signal, inverter 19 generates a power on reset signal POR which is at the H level. Thus initialization of the internal circuitry is completed. Since the L level signal from inverter 18 is applied to transistor 17, the power supply voltage Vdd is applied to inverter 18 through transistor 17. Therefore, a latch circuit 16 latches the L level, and power on reset signal /POR is maintained at the H level.

However, in the power on reset circuit 10, there is a problem that charges corresponding to the threshold voltage of transistor 17 are left in capacitor 15 even when the power is turned off. This is because the transistors 13 and 14 are each diode connected, and there is not a path through which charges of capacitor 15 are extracted, other than transistor 17. If the power is again turned on with charges still left in capacitor 15, power on reset circuit 15 cannot activate the power on reset signal /POR to the L level.

Power on reset circuit 10 is capable of keeping power on reset signal /POR at the H level unless power supply voltage Vdd fluctuates widely. However, if the power supply voltage Vdd fluctuates significantly, it may possibly activate the power on reset signal /POR to the L level again even after initialization.

SUMMARY OF THE INVENTION

Therefore, an object of the present invention is to provide a power on reset circuit which can surely generate a reset signal when the power is again turned on.

Another object of the present invention is to provide a power on reset circuit which does not erroneously generate a reset signal even when the power supply voltage fluctuates significantly.

According to the present invention, the power on reset circuit includes a load unit, a capacitor, a resistance element, and first and second CMOS inverter circuits. The load unit is connected between a power supply node and a first node. The capacitor is connected between a ground node and the first node. The resistance element is connected parallel to the capacitor. The first CMOS inverter has an input node connected to the first node, and an output node connected to the second node. The second CMOS inverter circuit has an input node connected to the second node, and an output node connected to the first node.

A main advantage of the present invention is that the capacitor is completely discharged when the power is turned off, and as a result, the reset signal is surely generated when the power is again turned on, since a resistance element is connected parallel to the capacitor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
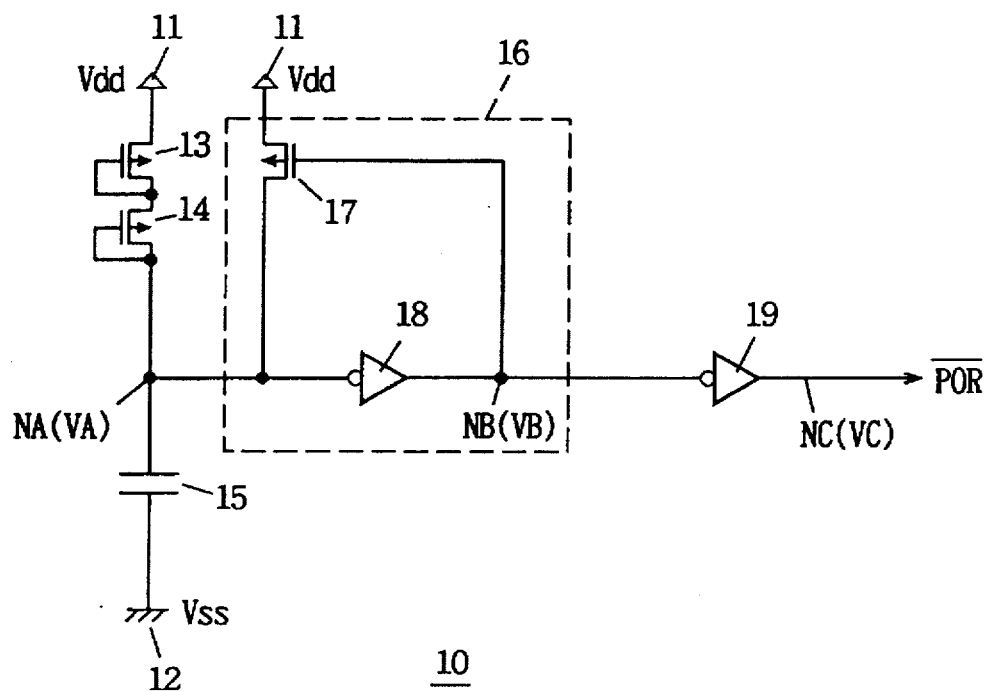
FIG. 1 is a schematic diagram showing a structure of a conventional power on reset circuit.

Embodiments of the present invention will be described in detail with reference to the figures. In the figures, like reference characters denote like portions.

First Embodiment

Figure 2:
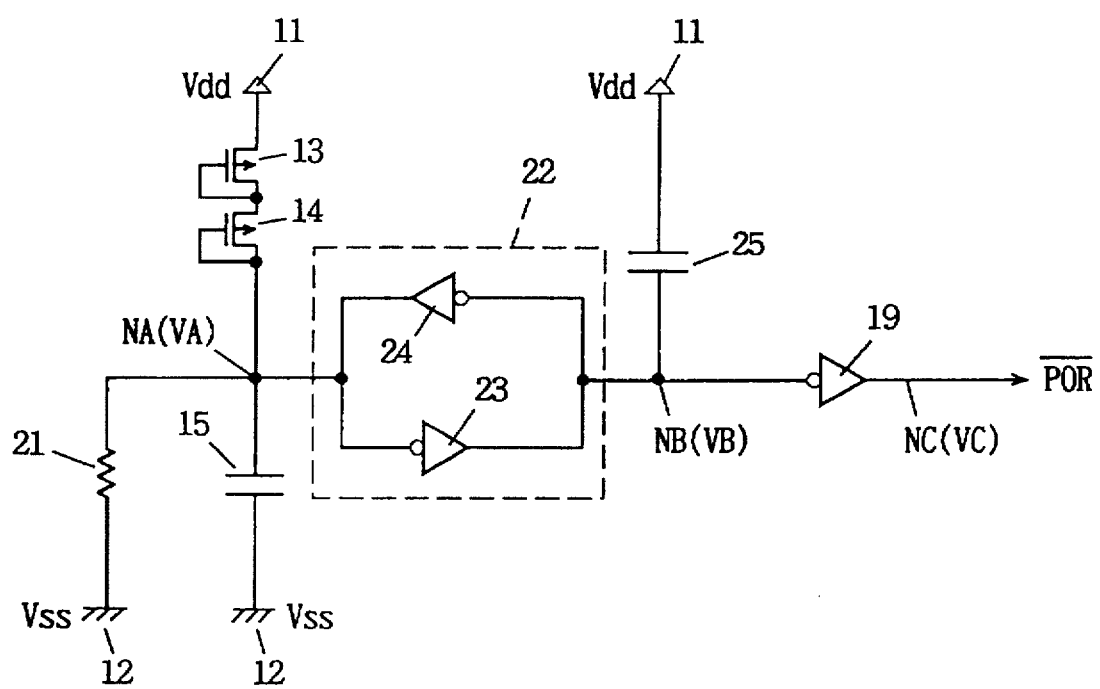
FIG. 2 is a circuit diagram showing a structure of a power on reset circuit in accordance with a first embodiment of the present invention.

Referring to FIG. 2, a power on reset circuit 20 in accordance with the first embodiment of the present invention includes P channel MOS transistors 13 and 14 connected in series, a capacitor 15, a resistance element 21 having high resistance value, a flipflop latch circuit 22, a capacitor 25, and an inverter 19 for waveform shaping. Transistors 13 and 14 are each diode connected, and connected between power supply node 11 and a node NA. Capacitor 15 is connected between ground node and node NA. Resistance element 21 is connected parallel to capacitor 15. Latch circuit 22 includes mutually cross coupled CMOS inverters 23 and 24. Inverter 23 has an input node connected to node NA, and an output node connected to node NB.

Inverter 24 has an input node connected to node NB, and an output node connected to node NA. Capacitor 25 is connected between power supply node 11 and node NB. Here, transistors 13 and 14 function as load elements for charging capacitor 15 when power supply voltage Vdd becomes higher than 2×Vth (Vth: threshold voltage of transistors 13, 14).

Figure 3:
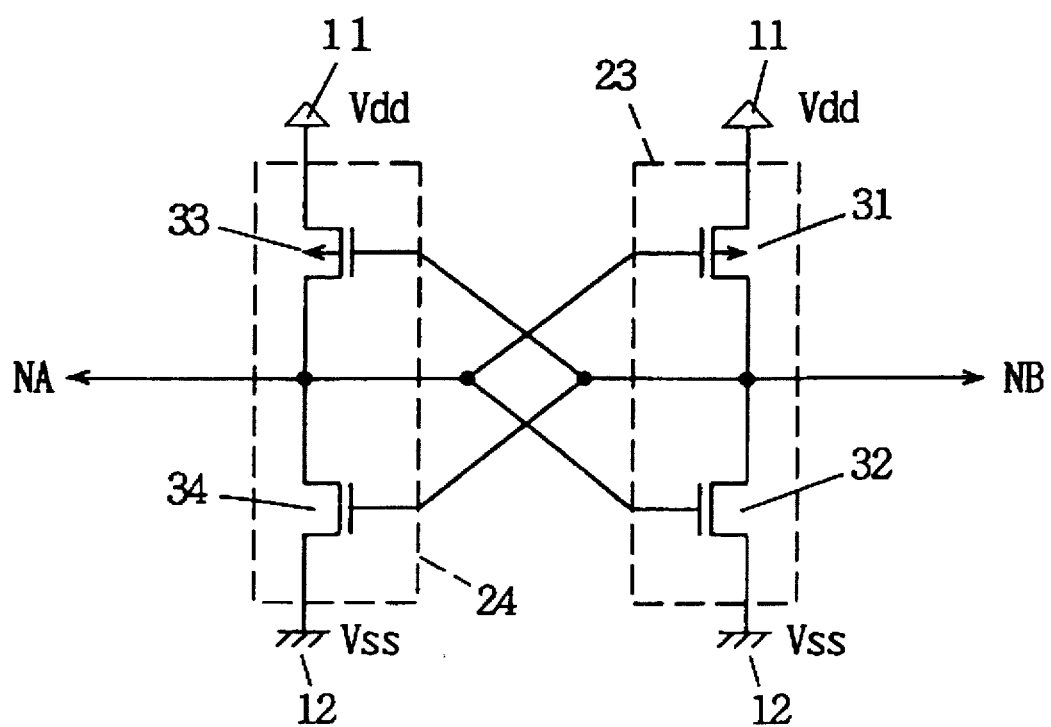
FIG. 3 is a schematic diagram showing a specific structure of a latch circuit shown in FIG. 2.

Referring to FIG. 3, CMOS inverter 23 in latch circuit 22 includes a P channel MOS transistor 31 and an N channel MOS transistor 32 connected in series between power supply node 11 and ground node 12. Another CMOS inverter 24 in latch circuit 22 includes a P channel MOS transistor 33 and an N channel MOS transistor 34 connected in series between power supply node 11 and ground node 12.

Figure 4:
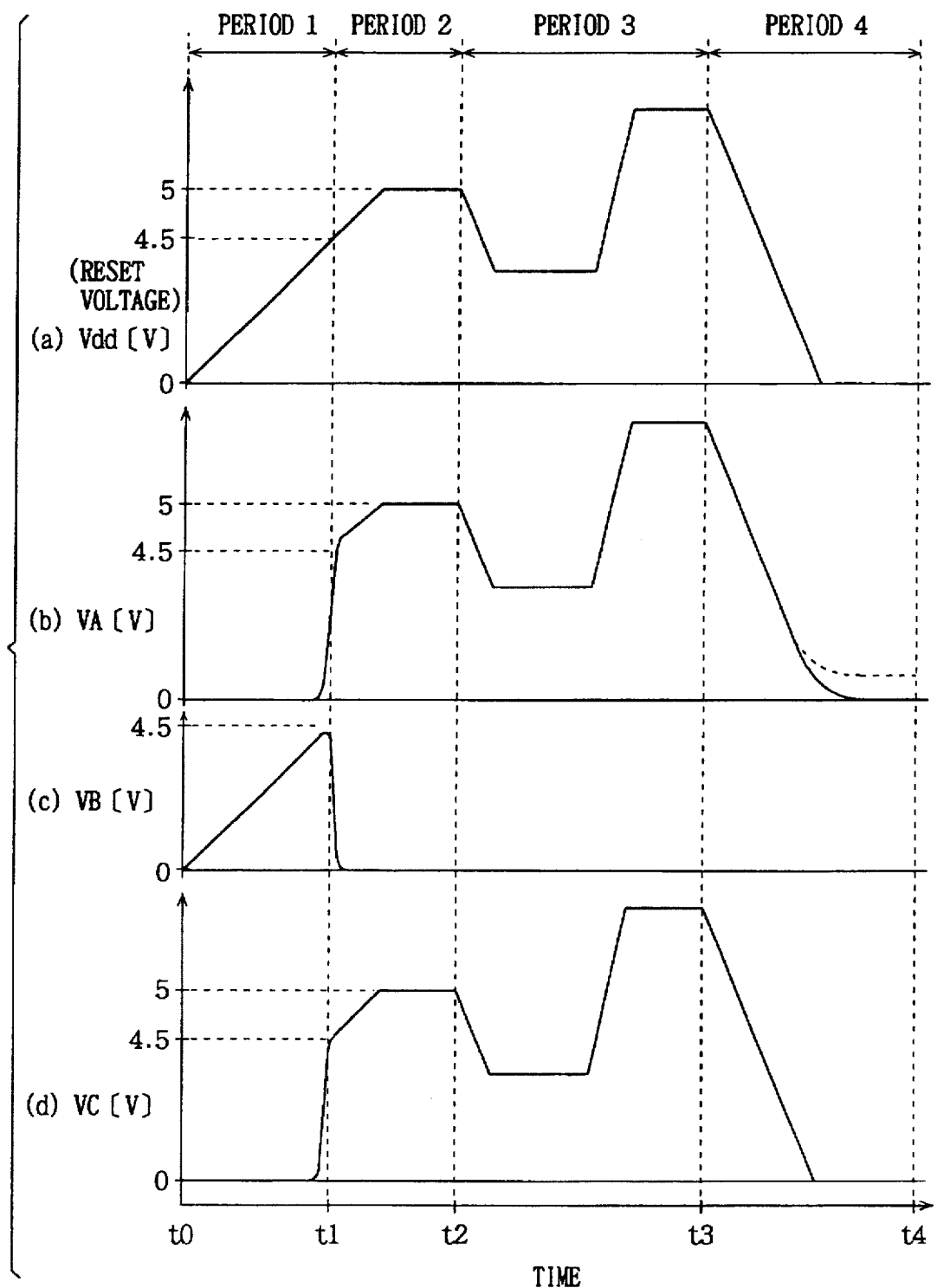
FIG. 4 is a timing chart showing the operation of the power on reset circuit shown in FIG. 2.

The operation of power on reset circuit structured as above will be described referring to FIG. 4. In FIG. 4, (a) shows change in power supply voltage Vdd with time, (b) shows change in voltage VA at node NA in FIG. 2, (c) shows change in voltage VB at node NB, and (d) shows change in voltage VC at node NC.

Referring to (a) of FIG. 4, when the power is turned on at time t0, power supply voltage Vdd rises from ground voltage Vss (0 V) to a prescribed voltage (for example, 5 V). In a period 1 from time t0 to time t1, as shown in (b) of FIG. 4, the voltage VA at node NA is pulled down toward ground voltage Vss by the coupling of capacitor 15, while the voltage of VB at node NB is pulled up toward the power supply voltage Vdd by the coupling of capacitor 25, as shown in (c) of FIG. 4. Accordingly, while the voltage VA at node NA is kept at the ground voltage Vss, the voltage of VB at node NB rises together with the power supply voltage Vdd. Therefore, as shown in (d) of FIG. 4, the voltage VC at node NC is kept at the ground voltage Vss.

Thereafter, when the power supply voltage Vdd has been increased to such a level at which a voltage exceeding the threshold voltage of latch circuit 22 is transmitted to node NA through transistors 13 and 14 (t1), the voltage VB at node NB falls to the ground voltage Vss (the power supply voltage at this time will be referred to as "reset voltage"). Therefore, the voltage VC at node NC rises to the power supply voltage Vdd. Here, when we assume that the threshold value of latch circuit 22 is 2.5 V and the threshold voltages of transistors 13 and 14 are 1.0 V, respectively, then the voltage VA at node NA would reach 2.5 V, which is the threshold value of latch circuit 22, when the power supply voltage Vdd reaches 4.5 V. Thereafter, in a period 2 from time point t1 to time point t2, the voltage VA at node NA follows the power supply voltage Vdd.

In a period 3 (t2 - t3) after the power supply voltage Vdd has reached a prescribed level, even when the power supply voltage Vdd fluctuates, the voltage VB at node NB is kept at the ground voltage Vss, since latch circuit 22 includes CMOS inverters 23 and 24 cross coupled to each other. Therefore, erroneous activation of power on reset circuit /POR can be prevented.

When the power is turned off at time t3, the power supply voltage Vdd lowers toward the ground voltage Vss in the period 4 from t3 to t4, and as the power supply voltage Vdd lowers, the voltage VA at node NA lowers as well. If resistance 21 were not provided, the voltage VA at node NA would not be lowered to the ground voltage Vss as shown by the dotted line in (b) of FIG. 4. If the power supply voltage Vdd becomes lower than 2×Vth (Vth: threshold voltage of transistors 13, 14), transistors 13 and 14 both turn off, and as a result, the voltage VA at node NA will never be lowered than the threshold voltage of transistor 33 in CMOS inverter 24. Therefore, if the inverter 24 includes a resistance element in place of transistor 33, the voltage VA at node NA would be lowered to the ground voltage Vss. However, in that case, current consumption will be increased as compared with a full CMOS structure.

However, in power on reset circuit 20, though the inverters 23 and 24 have CMOS structures, the voltage VA at node NA lowers to the ground voltage Vss as shown by the solid line in (b) of FIG. 4, since resistance element 21 is connected parallel to capacitor 15. The reason for this is that the capacitor 15 can be fully discharged by resistance element 21. Further, current consumption can be reduced, as inverters 23 and 24 both have the CMOS structure.

Now, let us assume that the capacitance of capacitor 15 is 1 [pF], the value of resistance element 21 is 100 [GΩ] and residual voltage at node NA is 1 [V]. Then the current I flowing through resistance element 21 can be calculated by the following simple equation (1).

$$I=1\ [V]/100\ [G\Omega]=10\ [pA] \tag{1}$$

Therefore, the time T necessary for the residual voltage of 1 [V] to disappear can be calculated in accordance with the following simple equation (2).

$$T=1\ [pF]\cdot 1\ [V]/10\ [pA]=0.1\ [Sec] \tag{2}$$

Namely, the residual voltage of capacitor 15 disappears only in 0.1 second, which means that the power on reset signal /POR is surely activated when the power is again turned on, provided that the power is kept off for a period longer than 0.1 second.

Therefore, according to the first embodiment, though latch circuit 22 includes CMOS inverters 23 and 24 to prevent erroneous generation of the power on reset signal associated with fluctuation of the power supply voltage Vdd and to reduce current consumption, the capacitor 15 can be fully discharged immediately after the power off, as the resistance element 21 is connected parallel to capacitor 15. Therefore, the power on reset signal can be surely activated when the power is again turned on. Further, since capacitor 25 is connected between node NB and power supply node 11, the voltage VB at node NB can be surely pulled up toward the power supply voltage Vdd when the power is turned on.

As described above, even when the power supply voltage Vdd fluctuates, erroneous activation of the power on reset signal can be prevented, and in addition, current consumption is reduced. Therefore, the power on reset circuit is especially effective when used in a device which is backed up by a battery.

Figure 5:
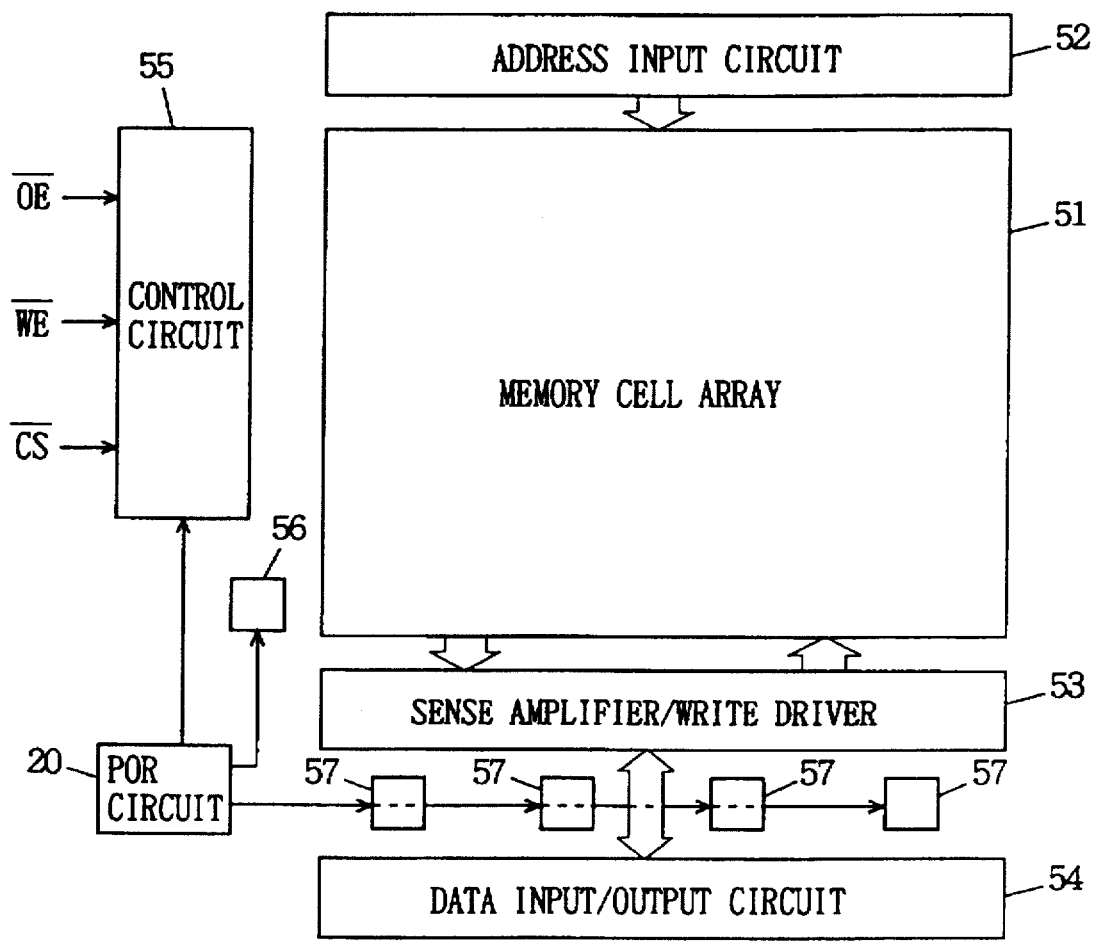
FIG. 5 is a block diagram showing an example of an SRAM for which the power on reset circuit is used.

Power on reset circuit 20 is used, for example, in the SRAM shown in FIG. 5. The SRAM includes a memory cell array 51 including static memory cells arranged in a matrix; an address input circuit 52 for inputting an address for specifying a memory cell; a sense amplifier/write driver 53 for amplifying data read from memory cell 51 and for amplifying data to be written to memory cell array 51; a data input/output circuit 54 for inputting/outputting data to and from sense amplifier/write driver 53; a control circuit 55 for controlling internal circuitry in response to an output enable signal $\overline{OE}$, a write enable signal $\overline{WE}$, a chip select signal $\overline{CS}$ or the like; a row redundant program circuit 56 for replacing a defective row in memory cell array 51 with a spare row; and a column redundant program circuit 57 for replacing a defective column in memory cell array 51 with a spare column. The power on reset signal generated by power on reset circuit 20 is supplied to control circuit 55, redundant row program circuit 56, redundant column program circuit 57 and so on, and the circuits 55 to 57 are initialized in response to the power on reset signal.

Figure 6:
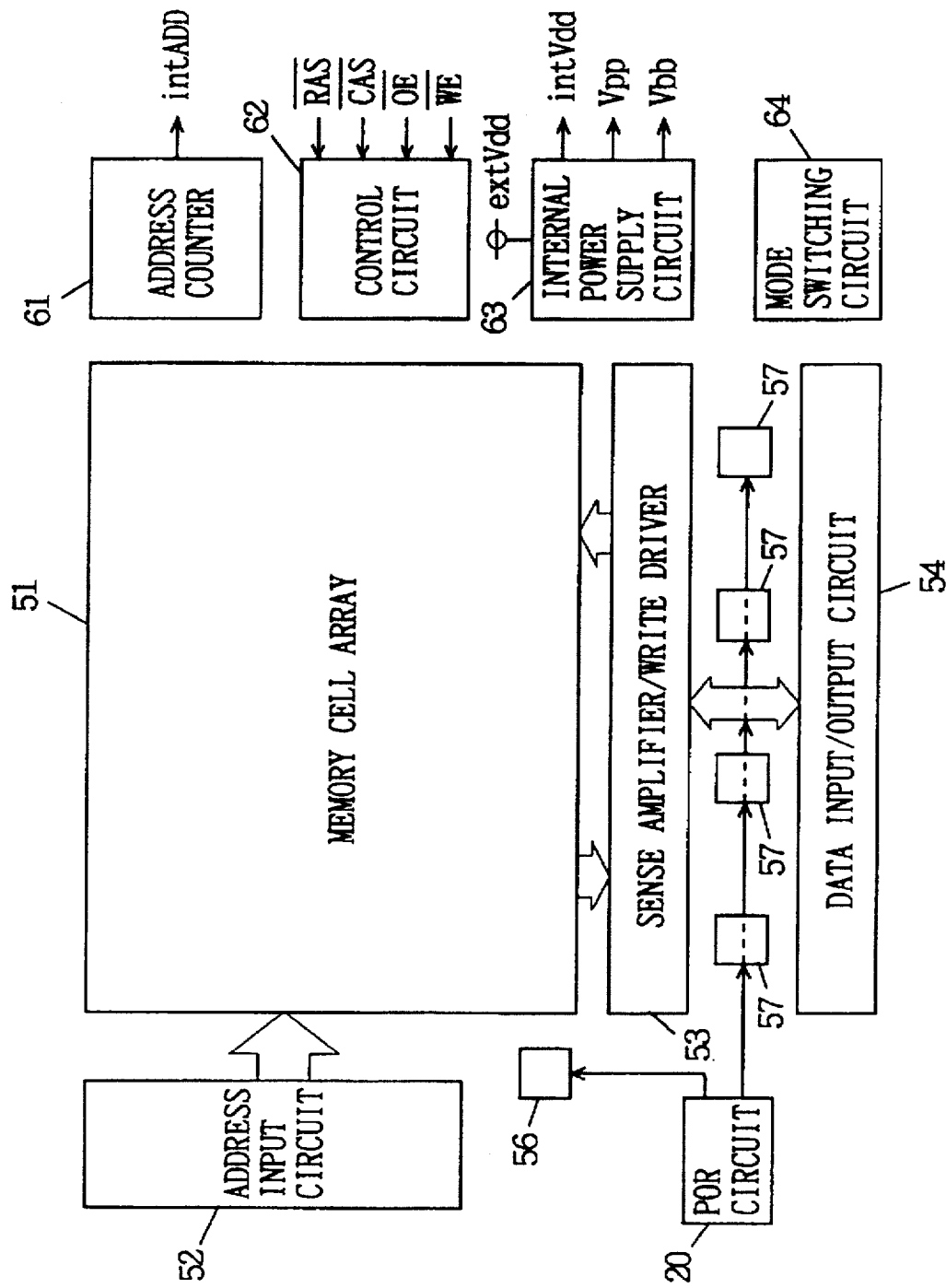
FIG. 6 is a block diagram showing an example of a DRAM for which the power on reset circuit is used.

The power on reset circuit 20 is also used in a DRAM shown in FIG. 6.

The DRAM includes a memory cell array 51 including dynamic memory cells arranged in a matrix; an address input circuit 52; a sense amplifier/write driver 53; a data input/output circuit 54; a row redundant program circuit 56; a column redundant program circuit 57; an address counter 61 for generating an internal address for refreshing, for example; a control circuit 62 for controlling internal circuitry in response to a row address strobe signal $\overline{RAS}$, a column address strobe signal $\overline{CAS}$, an output enable signal $\overline{OE}$, a write enable signal $\overline{WE}$ or the like; an internal power supply circuit 63 for generating an internal power supply voltage intVdd, a boosted voltage Vpp, a substrate voltage Vbb or the like based on an external power supply voltage extVdd; and a mode switching circuit 64 for switching between each of a nibble mode, a page mode, a test mode and the like. The power on reset signal generated by power on reset circuit 20 is supplied to address counter 61, control circuit 62, internal power supply circuit 63, mode switching circuit 64, redundant row program circuit 56, redundant column program circuit 57 and so on. Therefore, these circuits 61 to 64, 56, 57 are initialized in response to the power on reset signal.

Second Embodiment

In the first embodiment, MOS transistors 13 and 14 are used as load elements for charging capacitor 15. However, it is difficult to set the threshold voltages of transistors 13 and 14 at desired values, due to variation in manufacturing process.

Figure 7:
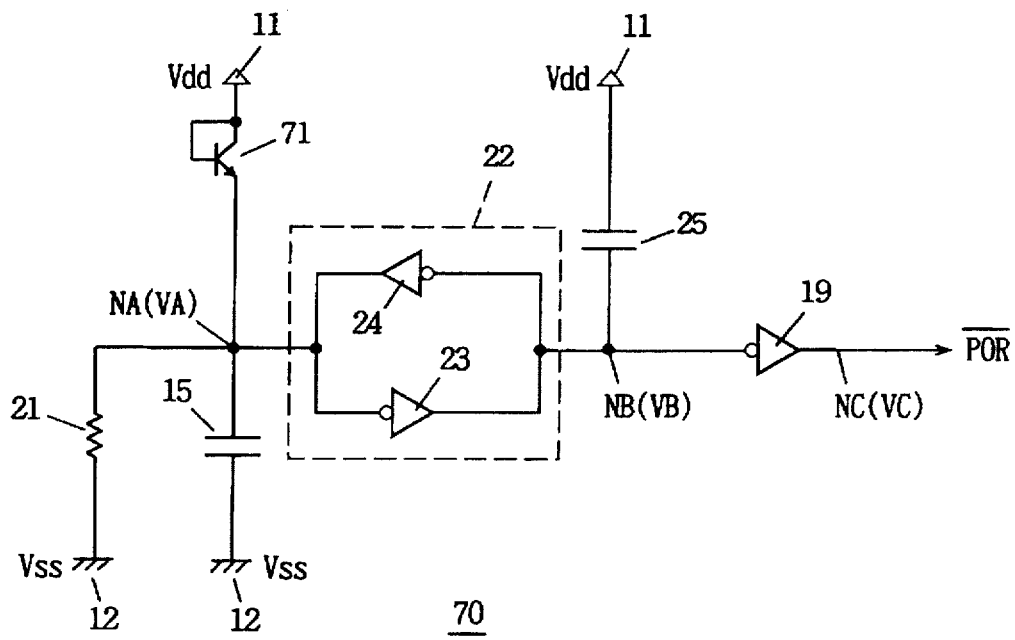
FIGS. 7 and 8 are schematic diagrams showing structures of the power on reset circuit in accordance with the second and third embodiments of the present invention, respectively.

A power on reset circuit 70 in accordance with the second embodiment shown in FIG. 7 uses a bipolar transistor 71 which does not depend on variation in the manufacturing process. The bipolar transistor 71 is diode connected and connected between power supply node 11 and node NA. Therefore, instead of MOS transistors 13 and 14, the bipolar transistor 71 turns on when the power supply voltage Vdd becomes higher than a pn junction voltage, and starts charging the capacitor 15. Since the threshold voltage of bipolar transistor 71 is determined by the pn junction voltage, it does not depend on variation in the manufacturing process. Since bipolar transistor 71 is used as a load element for charging capacitor 15 in the second embodiment, transistor 71 having a desired threshold voltage can be readily manufactured. Therefore, a power on reset circuit generating a power on reset signal for a desired period can be provided.

Third Embodiment

Figure 8:
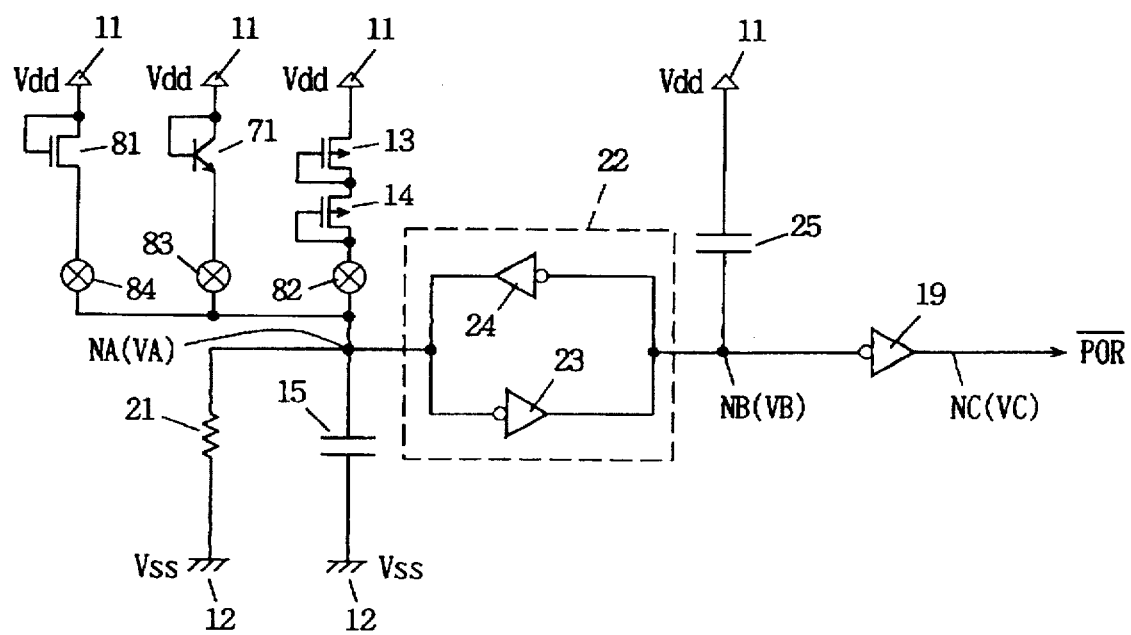

Referring to FIG. 8, a power on reset circuit 80 in accordance with the third embodiment includes, in addition to the structure of the first embodiment, a diode connected bipolar transistor 71, a diode connected N channel MOS transistor 81, a fuse element 82 connected in series with P channel MOS transistors 13 and 14, a fuse element 83 connected in series with transistor 71, and a fuse element 84 connected in series with transistor 81. Transistor 71 is connected between power supply node 11 and node NA, and may function as a load element for charging capacitor 15. Transistor 81 is also connected between power supply node 11 and node NA and it may function as a load element for charging capacitor 15. When fuse element 82 is blown off, transistors 13 and 14 are inactivated. When fuse element 83 is blown off, transistor 71 inactivated. When fuse element 84 is blown off, transistor 81 is inactivated.

Assume that the threshold voltage of P channel MOS transistors 13 and 14 is 0.5 V, the threshold voltage of bipolar transistor 71 is 0.8, that of N channel MOS transistor 81 is 0.5 V and that of latch circuit 22 is 0.5 V. When fuse elements 83 and 84 are blown off, only the transistors 13 and 14 are activated, and hence reset voltage (power supply voltage Vdd at which the voltage VA at node NA and voltage VB at node NB are inverted) VR can be calculated in accordance with the following simple equation (3).

VR=threshold voltage of transistor 13+threshold voltage of transistor 14+threshold voltage of latch circuit 22=1.5 [V]  (3)

When the fuse elements 82 and 83 are blown off, the reset voltage can be calculated in accordance with the following equation (4).

VR=threshold voltage of transistor 81+threshold voltage of latch circuit 22=1.0 [V]  (4)

When fuse elements 82 and 84 are blown off, reset voltage VR can be calculated in accordance with the following equation (5).

VR=threshold voltage of transistor 71+threshold voltage of latch circuit 22=1.3 [V]  (5)

In the third embodiment, a plurality of load elements having different threshold voltages are connected parallel to each other and a fuse element is connected in series with each of the load element. Therefore, by appropriately blowing off the fuse element, desired reset voltage can be set.

Though three load elements are connected in parallel in the third embodiment, two or four or more load elements may be connected in parallel. The number of transistors constituting each load element is not limited at all.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power on reset circuit, comprising:

load means connected between a first power supply node and a first node;

a first capacitor connected between a second power supply node and said first node;

resistance means connected parallel to said first capacitor;

a first CMOS inverter circuit having an input node connected to said first node and an output node connected to a second node; and a second CMOS inverter circuit having an input node connected to said second node and an output node connected to said first node.

2. The power on reset circuit according to claim 1, further comprising a second capacitor connected between said first power supply node and said second node.

3. The power on reset circuit according to claim 2, wherein said load means includes a diode-connected bipolar transistor.

4. The power on reset circuit according to claim 2, wherein said load means includes a plurality of load elements connected parallel to each other, and a plurality of fuse elements corresponding to said plurality of load elements, each connected in series to corresponding one of said plurality of load elements.

* * * * *